United States Patent [19]

McElhanon et al.

[11] Patent Number: 5,407,787

[45] Date of Patent: Apr. 18, 1995

[54] PROCESS TO FABRICATE THICK COPLANAR MICROWAVE ELECTRODE STRUCTURES

[75] Inventors: Robert W. McElhanon, Bryans Road, Md.; Ganesh K. Gopalakrishnan, Lorton; William K. Burns, Alexandria, both of Va.

[73] Assignee: The United States of America as represented by the Secretary of the Navy, Washington, D.C.

[21] Appl. No.: 77,903

[22] Filed: Jun. 18, 1993

Related U.S. Application Data

[63] Continuation-in-part of Ser. No. 46,293, Apr. 14, 1993.

[51] Int. Cl.$^6$ .............................................. G03C 5/16
[52] U.S. Cl. .................................. 430/315; 430/320; 430/321; 430/324; 430/330
[58] Field of Search ............... 430/311, 315, 320, 321, 430/324, 330

[56] References Cited

U.S. PATENT DOCUMENTS

| | | | |
|---|---|---|---|
| 4,187,331 | 2/1980 | Ma | 430/328 |
| 4,253,888 | 3/1981 | Kikuchi | 148/187 |
| 4,897,337 | 1/1990 | Kato | 430/330 |

OTHER PUBLICATIONS

Englemann et al., "Fabrication of High Depth-to-Width Aspect Ratio Microstructures", Micro Electrical Mechanical Systems '92 pp. 93–98 (Feb. 4–7, 1992).

Enthone-OMI, Sel-Rex® Technical Data Sheet, Sel-Rex® Pur-A-Gold® 402.

Ma, "Plasma resist image stabilization technique (PRIST) update", SPIE 333 pp. 19–23 (1982).

Hoechst Inc., "AZ® 4000 Series Photoresists: For Thick Film Applications", Product Brochure.

Hoechst Inc., "AZ® 4903 Photoresist for Ultra-Thick Film Applications", Product Brochure.

Löchel et al., "Fabrication of Magnetic Microstructures by Using Thick Layer Resists", Suss Report pp. 7–9 (1992).

Primary Examiner—Marion E. McCamish
Assistant Examiner—Kathleen Duda
Attorney, Agent, or Firm—Thomas E. McDonnell; John J. Karasek

[57] ABSTRACT

A process for making thick metal structures on a substrate has the steps of: selectively exposing a thick layer of photoresist disposed on a substrate to ultraviolet radiation including the 350 nm to 450 nm portion of tile spectrum of a mercury vapor lamp, where the photoresist layer is a heat-treated arid hydrated photoresist layer, to fully pattern the substrate: developing the patterned substrate by contacting the photoresist layer with a photoresist developing solution; exposing the photoresist layer to a plasma for hardening the pattern against thermal flow; hardbaking the photoresist pattern on the substrate; plating the metal onto the patterned substrate using a low current density (J) during at least part of the plating process, making a thick methyl structure on the substrate.

22 Claims, 3 Drawing Sheets

PROCESS TO FABRICATE THICK COPLANAR MICROWAVE ELECTRODE STRUCTURES

CROSS REFERENCE TO RELATED APPLICATION

This is a continuation-in-part of prior application Ser. No. 08/046,293, NEW DESIGN FOR LOW V ELECTROOPTIC MODULATORS, filed Apr. 14, 1993, by Gopalakrisnan et al., and incorporated herein by reference.

BACKGROUND OF THE INVENTION

1. Field of the Invention

The present invention relates to microlithographic fabrication, and more particularly to fabricating thick coplanar metallic microwave guides and electrodes.

2. Description of the Related Art

Thick ($\geq \approx 5$ μm) metallic coplanar microwave electrodes and waveguides are desired for a number of applications, including resonant devices, nonresonant devices, and microwave/optical I/O modulators.

It is desired to make these structures arcuate or annular. It is also desired to make these structures with consistent sidewall angles.

In the case of microwave/optical I/O modulators, it is desired to provide good microwave-optical propagation velocity matching in the modulator. A microwave/optical I/O modulator is a device for converting a microwave signal into an optical signal. It is useful in microwave signal processing, since optical signals are generally simpler to work with than microwave signals. These modulators include a microwave guide and an optical waveguide, positioned for coupling between the two waveguides to provide signal modulation from one waveform to the other waveform. To achieve a high bandwidth for these modulators, it is necessary to achieve good matching of the propagation velocities for the microwave and optical waveforms in their respective waveguides.

The velocity of microwaves in a metallic coplanar guide is highly sensitive to the thickness and sidewall angle of the guide. Ideally, the sidewall angles of these electrodes are consistent, so that the propagation velocity will be governed only by the electrode thickness. However, making thick ($\geq \approx 10$ μm) metallic structures with consistent sidewall verticality has proven to be difficult.

Problems with making these structures by photolithography include cracking in the thick photoresist layer, achieving full exposure throughout the photoresist layer, lift-off, and thermal flow degrading the photolithographic image.

SUMMARY OF THE INVENTION

Accordingly, it is an object of this invention to make thick metallic structures with consistent sidewall angles by a photolithographic technique, without cracking, lift-off, incomplete exposure, or thermal flow.

It is a further object of this invention to make arcuate and annular thick metallic structures by a photolithographic technique, without cracking, lift-off, incomplete exposure, or thermal flow.

These and additional objects of the invention are accomplished by the structures and processes hereinafter described.

A process for making thick metal structures on a substrate has the steps of: selectively exposing a thick layer of photoresist disposed on a substrate to ultraviolet radiation including the 350 nm to 450 nm portion of the spectrum of a mercury vapor lamp, where the photoresist layer is a heat-treated and hydrated photoresist layer, to fully pattern the substrate; developing the patterned substrate by contacting the photoresist layer with a photoresist developing solution; exposing the photoresist layer to a plasma for hardening the pattern against thermal flow; hardbaking the photoresist pattern on the substrate; plating the metal onto the patterned substrate using a low current density (J) during at least part of the plating process, making a thick metal structure on the substrate.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS OF THE INVENTION

It is critical to this invention to use ultraviolet light having wavelengths between about 350 nm to about 450 nm (UV 400), to harden the developed photoresist with a fluorocarbon plasma, and to carefully select the current densities used-during the plating process.

The UV 400 band of radiation provides the ability to fully expose thick films, which the UV band between about 280 nm and about 350 nm (UV 300) does not provide. The use of the fluorocarbon plasma prevents thermal flow and lift off of the photoresist. Carefully selecting the current densities used during plating prevents lift-off of the photoresist during plating without degrading the top surface quality of the photoresist.

Figure 1:
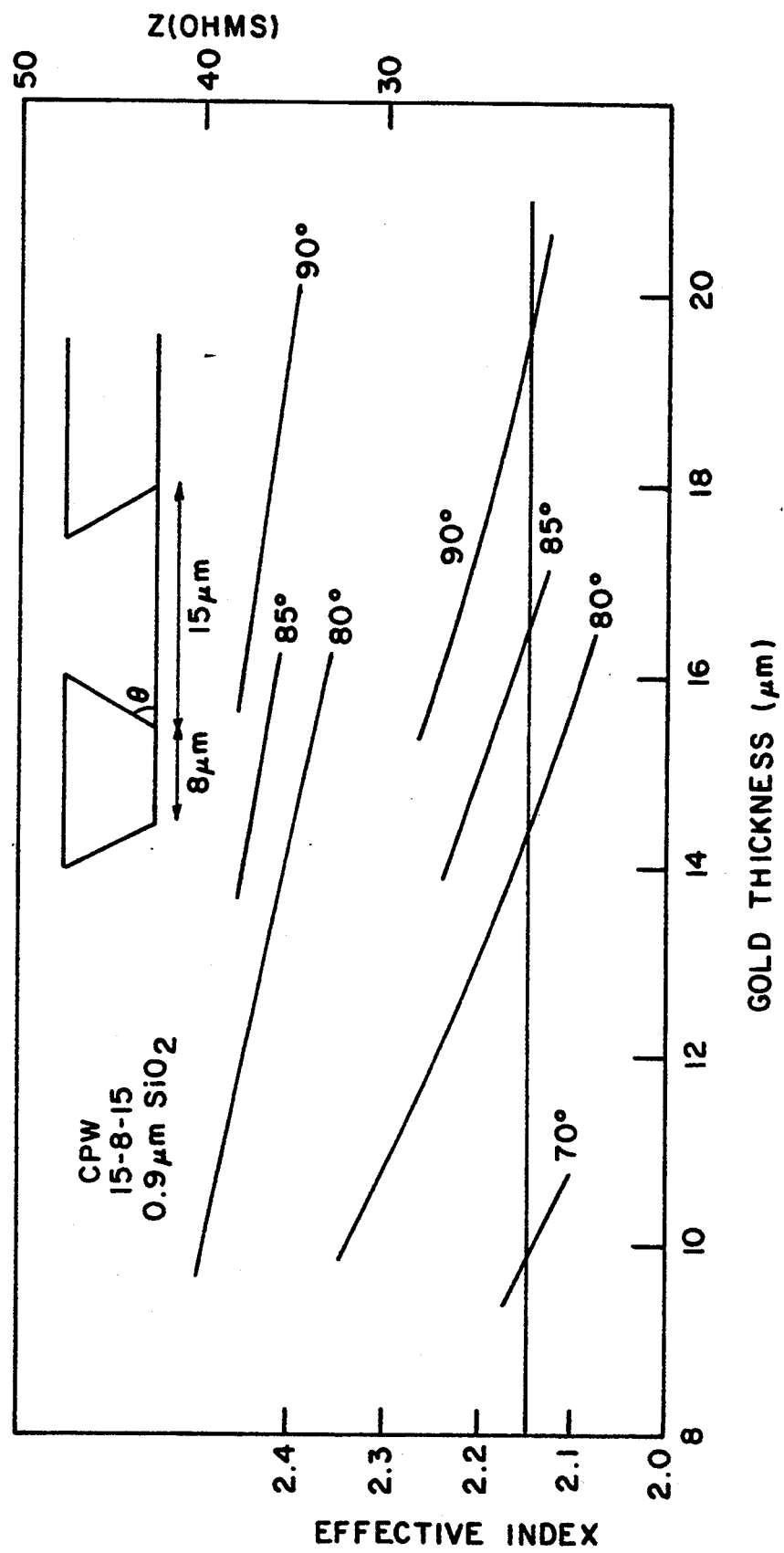
FIG. 1 shows the impedance and effective index of a gold electrode as functions of thickness and sidewall angle.
Figure 2:
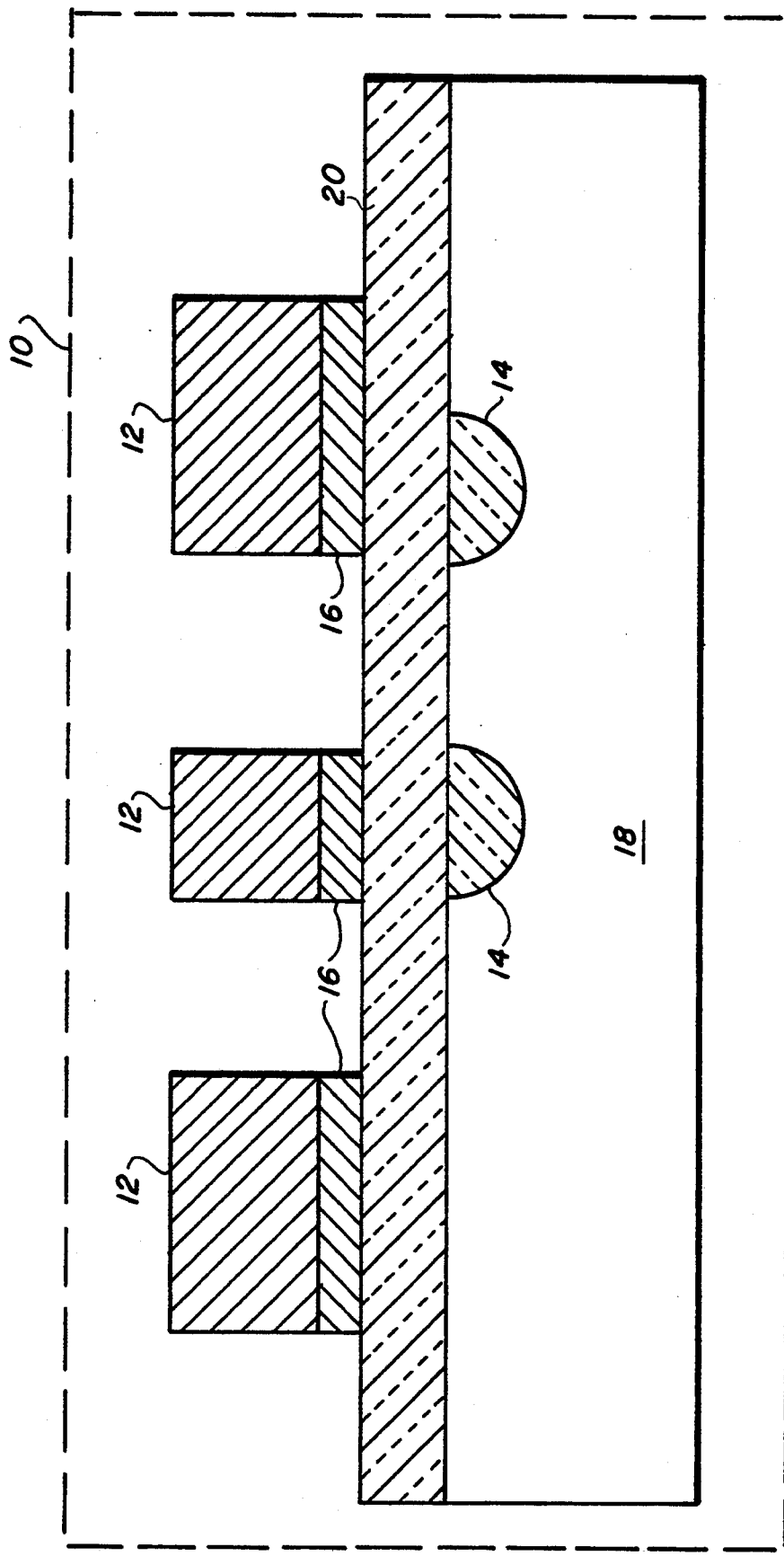
FIG. 2 shows a representational view of a cross-section of a microwave/optical I/O modulator.

The terms "thick metallic structures" and "thick photoresist layers" are defined herein to mean structures and layers having thickness between about 10 μm and about 50 μm. For microwave/optical I/O modulators 10, it is preferred to have metal electrodes 12 at least 10 μm, 15 μm, or 20 μm thick. As shown in FIG. 1, a 2 μm thick gold electrode 12 pathway with a vertical ($\theta = 90°$) sidewall will have an effective index $n_m = 2.15$, indicating velocity matching with light in an optical waveguide 14. Likewise, a 16.5 μm thick gold electrode pathway 12 with a sidewall angle of $\theta = 85°$ will have an effective index $n_m = 2.15$. For other applications, such as for various resonant and nonresonant microwave devices, it will be preferred to have gold pathways 12 at least about 40 μm to 50 μm thick.

Before the photoresist film is deposited, a thin ($\approx 500$Å to $\approx 1000$Å) conductive layer 16 (preferably gold) will be deposited on the substrate 18, typically by evaporation. This thin gold film 18 will serve as the cathode during plating. After the pattern is developed, the gold layer 18 will be etched away.

It is preferred to deposit a thick photoresist film on a substrate in stages, by building the film up layer by layer. Preferably, a photoresist designed for making thick films is employed. Preferably, the substrate is first dehydrated, and is optionally treated with a commercial photoresist adhesion promoter. A thick-film photoresist is preferably puddled in the middle of the substrate, and the substrate is spun to produce a film of the desired thickness. The resist is preferably partially solidified by baking at preferably between about 80° C. to about 120° C. for about 2-6 minutes. This coating and baking cycle is repeated until the desired photoresist thickness is achieved.

After the photoresist is deposited, the wafer perimeter will typically have an edgebead. This is preferably removed prior to exposure by baking the edgebead for between about 30 to 300 seconds at about 80° C. to 110° C. and then dissolving away the edgebead with acetone.

It is preferred to softbake the photoresist prior to exposure at about 80° C. to 110° C. This is preferably done for about 5 to 10 minutes, including the time for the baking done before the edgebead removal.

It is preferred to allow the photoresist to absorb water vapor prior to exposure, typically by allowing the photoresist to sit for between about 20 minutes to 2 hours, depending on the relative humidity.

It has been discovered that ultraviolet exposure techniques that fully expose thin films do not fully expose thick ($\gtrsim \approx 5$ μm) films. Typically, photoresist films are exposed with filtered light from mercury vapor lamps so that the incident radiation includes the UV 300 portion of the spectrum. It has been discovered that when only this portion of the UV spectrum is used to expose thick films, the bottom portion of these films remain unexposed, apparently regardless of exposing intensity and duration. Exposing these thick films to unfiltered light from mercury vapor lamps, i.e. ultraviolet light including the I, H, and G lines from the UV 400 band, will fully expose even very thick ($\gtrsim \approx 20$ μm) photoresist films.

After exposure, the photoresist is developed with any of the commercially available photoresist developers.

It has been discovered that, once developed, thick photoresist films are particularly susceptible to thermal flow during the hardbaking process. Frequently during hardbaking, the photoresist develops an "overhang" cross-section, with the photoresist pattern wider at the top than at the bottom. This results in the deposited metal "undercutting" and lifting-off the photoresist, destroying the pattern.

A different problem has been discovered with respect to arcuate and annular patterns: The baked photoresist pattern tends to "lean into" curves, with the photoresist tipped inward in curved sections of patterns. This tendency also leads to the deposited metal undercutting and lifting-off the photoresist.

It has been discovered that fluorocarbon plasma hardening of the photoresist permits the deposition of very thick metallic films 12. Fluorocarbon plasma hardening of thin ($\approx 2$ μm) photoresist films is a known technique. See Ma, "Plasma resist image stabilization technique (PRIST) update", SPIE Vol. 333 Submicron Lithography pp. 19–23 (1982). To date, however, it has not been taught or suggested that one can successfully harden a thick photoresist film against thermal flow by treatment with fluorocarbon plasma (Ma teaches the use of AZ® 1350, a thin film resist, with this technique).

Preferably, the plasma is a plasma of CF$_4$ diluted with N$_2$, Ar, or He. Most preferably, the plasma is a plasma of CF$_4$ diluted with He. Preferred concentrations of CF$_4$ range from about 15% CF$_4$ (partial pressure over total pressure) to about 40% CF$_4$. More preferred concentrations of CF$_4$ range from about 20% to about 30%. Higher concentrations confer no significant benefit while increasing costs; lower concentrations will require longer treatment times and may be less effective. Preferred applications of RF power range from about 25 W to about 100 W. In a preferred embodiment of the invention, the treatment time will be between about 30 seconds and about 60 seconds. It is generally preferred to keep the treatment time at a minimum time that will prevent thermal flow during hardbaking, to maximize throughput.

It has been discovered that thick photoresist films are particularly susceptible to cracking during cooling after hardbaking. This has been attributed to the buildup of stress in the photoresist as the upper portion of the photoresist layer cools more quickly than the portion closer to the substrate. This problem can be remedied by slowly cooling the hardbaked structure. This will typically be done by so-called "furnace cooling", where the hardbaked structure is allowed to cool to close to room temperature before it is removed from the furnace. Cooling at a rate of between about 1° C./min and about 5° C./min should be sufficiently slow to prevent cracking in most thick films.

It has been discovered that the plating current density J (defined as the applied current divided by the exposed area for plating) typically used to deposit metal electrodes is not appropriate for depositing thick electrodes 12. For example, SEL-REX® 402 makeup (a neutral-base gold plating solution) is recommended by the manufacturer to be plated onto substrates with current densities ranging from $J=1.1$ mA/cm$^2$ to $J=5.0$ mA/cm$^2$, with $J=3.0$ mA/cm$^2$ being preferred. However, it has been discovered that lower current densities, ranging from about 0.3 mA/cm$^2$ to about 0.9 mA/cm$^2$, are preferred for depositing thick metal electrodes 12. More preferably, current densities ranging from about 0.4 mA/cm$^2$ to about 0.8 mA/cm$^2$ are used to deposit thick metal electrodes 12.

It has been discovered that when the current density is too high, the plating solution tends to attach to the cathode layer 16 with too much vigor. The metal in the solution is pulled to the cathode 16 so forcefully that it tends to undercut the photoresist and lift it off the wafer from the bottom. On the other hand, if the wafer is in the plating solution too long, the solution degrades the photoresist and lifts it off from the top. Consequently, the current density is most preferably varied during the plating process. A lower current density is most preferably applied at the beginning of the plating process, until the deposited metal has built up sufficiently to prevent this undercutting (between about 30 and 120 minutes will suffice at between about 0.4 mA/cm$^2$ and about 0.5 mA/cm$^2$). A higher current density is most preferably applied later in the plating process, to accelerate the plating process (between about 0.7 mA/cm$^2$ and about 0.8 mA/cm$^2$ will typically suffice).

For microwave/optical I/O modulators 10, the substrate 18 will be an electrooptic crystalline material, which changes its optical index upon the application of an electric field. Preferred electrooptic crystalline materials include LiNbO$_3$, LiTaO$_3$, and KTP.

The optical waveguides 14 embedded in the substrate 18 typically are made by diffusing a selected species into the substrate 18. For example, a titanium waveguide 14

3 μm deep×7 μm wide will be preferred for transmitting 1.3 μm light, while a titanium waveguide 14 3 μm deep×8 μm wide will be preferred for transmitting 1.5 μm light (optimizing transmission at these λs).

The microwave/optical I/O modulator 10 preferably will have an optically transparent dielectric buffer layer 20 sputtered over the substrate 18 with the embedded optical waveguides 14. Preferred buffer layer materials include $SiO_2$, sapphire, and InSnO. The thickness of this buffer layer 20 preferably will be selected to provide microwave/optical velocity matching. Typical buffer layer thicknesses for $SiO_2$ will range from about 0.7 μm to about 1.1 μm.

Having described the invention, the following examples are given to illustrate specific applications of the invention, including the best mode now known to perform the invention. These specific examples are not intended to limit the scope of the invention described in this application.

Figure 3A:
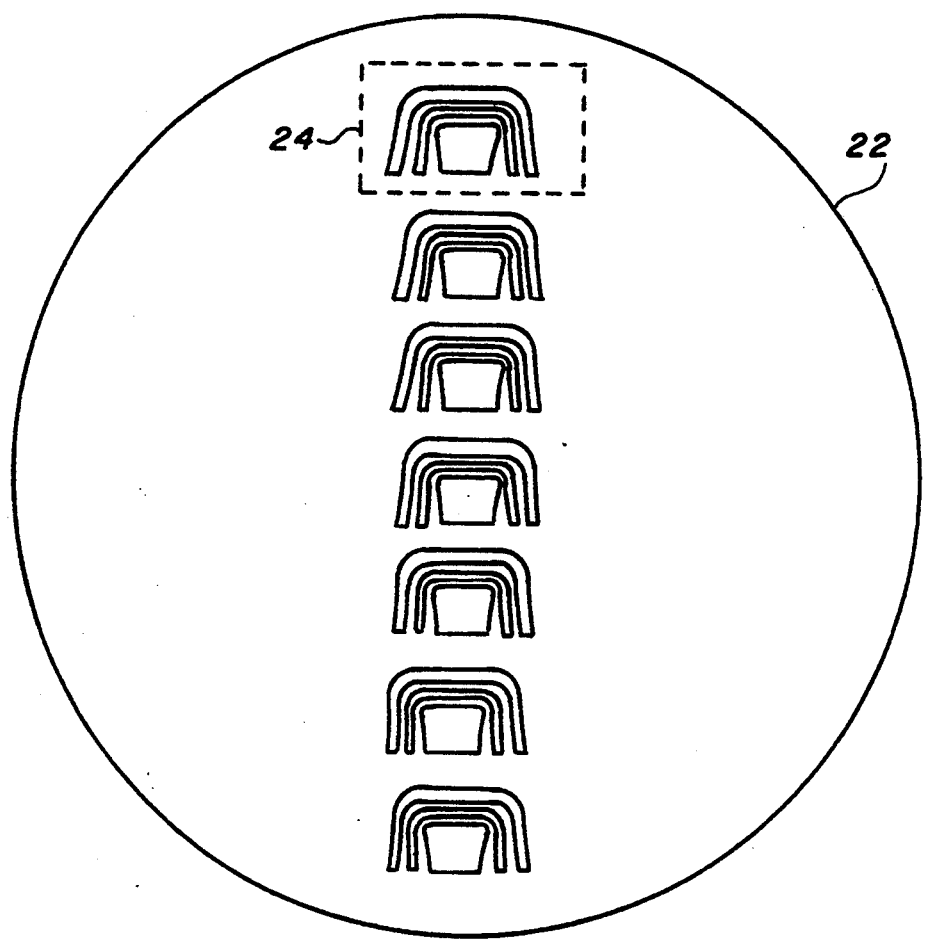
FIG. 3A shows a mask for making arcuate structures.
Figure 3B:
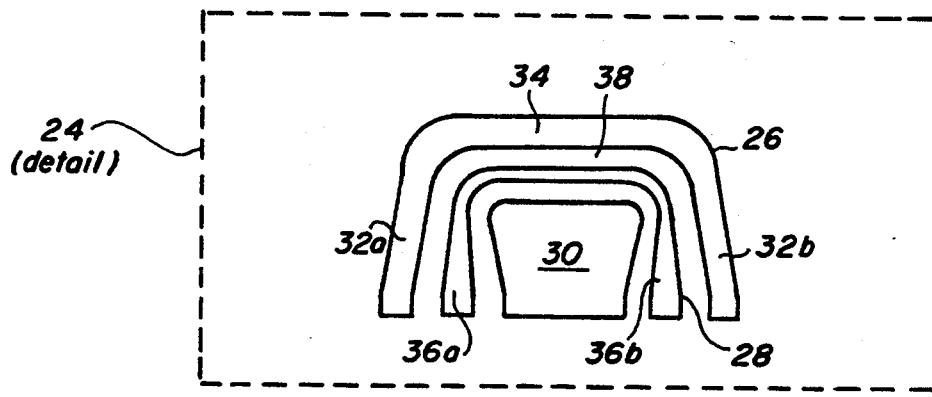
FIG. 3B shows a detail of this mask.

For all these examples, the mask 22 shown in FIGS. 3A and 3B was used to expose the photoresist. This mask 22 measured 3″ across, and had 6 identical arcuate patterns 24 defined in its center, each comprising an outer arc 26, an inner arc 28, and a center area 30.

The outer arc 26 had a linewidth of 2000 μm, and measured 25,123 μm between its legs 32a,32b. The legs 32a,32b of the outer arc 26 measured roughly 3,123 μm long, and the top section 34 of the outer arc 26 measured roughly 2,630 μm long.

The inner arc 28 had a linewidth varying from a maximum of 305 μm at the ends of the legs 36a,36b to a minimum of 8 μm at tops of the legs 36a,36b, through the curved portions of the arc and through the top section 38 of the arc 28. The legs 36a,36b of the inner arc measured roughly 3,100 μm long, and the top section of the inner arc measured roughly 24,246 μm long.

The center area 30 of the pattern was somewhat wider at the top than at the bottom, measuring 23,293 μm wide at the bottom and 24,467 μm wide at the bottom. The center area 30 was 3085 μm high, and had rounded corners on the top.

This mask had an exposing area of $6 \times 1.4131$ $cm^2 = 8.4786$ $cm^2$.

EXAMPLE 1

PREPARATION AND TESTING OF A MICROWAVE/OPTICAL I/O PHASE MODULATOR

A fiber optical waveguide 14 measuring 3 μm deep×7 μm wide (λ=1.3 μm) was defined on an LiNbO$_3$ substrate 18 by diffusing titanium in a channel waveguide pattern. A 0.9 μm thick $SiO_2$ buffer layer 20 was sputtered over the substrate 18 and waveguide 14. A 500Å layer of gold 16 was evaporated over the $SiO_2$ buffer layer 20. The wafer was dehydrated at about 150° C. for 60 minutes.

The dehydrated wafer was treated with several ml of AZ® Adhesion Promoter. Several ml of AZ® 4620 photoresist were puddled in the center of the wafer, in sufficient quantity to cover the area to be exposed through the mask. The resist was spun at 2000 rpm for 30 seconds, to spread the photoresist into a film. The wafer was baked in a convection oven for 3 minutes at 90° C. to slightly solidify the photoresist layer.

Very quickly, another several ml of AZ® 4620 photoresist was puddled in the center of the wafer, and spun at 200 rpm for 30 seconds. This step was repeated until the photoresist layer was about 15 μm thick.

The wafer was baked on a hotplate at 110° C. for 1 minute to harden the edgebead for removal. The edgebead was washed away with acetone. The resist was softbaked on a hotplate for 360 seconds at 110° C., and allowed to stand for 20 minutes to permit the photoresist to absorb water vapor.

The mask 22 was placed on the wafer, and positioned so that the top section 38 of an inner arc 28 was positioned over and parallel to the optical waveguide 14. The wafer was exposed to the full spectrum of a high-pressure Hg vapor lamp (185 $mJ/cm^2$ measured on 320 nm line) for 35 seconds. The exposed wafer was then developed with a solution of AZ® 400K developer in deionized water (3:1) for about 2.5 minutes to clear (.i.e. fully develop the photoresist).

The wafer was placed in a reactive ion etcher (RIE) and treated with a plasma (150 mTorr He and 50 mTorr $CF_4$, 50 W power for 45 seconds) to harden the photoresist. The plasma-hardened wafer was hardbaked in a convection oven for 1 hour at 110° C. The oven was initially cool, and was turned on after the wafer was inserted. The wafer was allowed to slowly cool to room temperature before being removed from the oven, at least about 120 minutes.

The exposed plate was connected to a Hewlett-Packard Model 6218C DC power supply (0–50 V, 0–0.2 A). This model has a fine current control (within 1 mA precision). The 500Å gold underplate 16 on the wafer was connected to the negative terminal on the power supply with an alligator clip. A platinum electrode was connected to the positive terminal on the power supply. A Fluke hand-held multimeter was connected in series to the power supply, to accurately monitor the applied current.

The platinum electrode and the wafer were both put into a SEL-REX® 402 makeup plating bath. 0.4 $mA/cm^2$ current was applied for 1 hour. The current density was increased to 0.8 $mA/cm^2$, and this current was applied for another 4 hours. During the plating process, the bath was slowly magnetically stirred, and held at between 55° C. and 60° C. The wafer was kept in the plating bath throughout the plating cycle.

EXAMPLE 2

PREPARATION AND TESTING OF A MICROWAVE/OPTICAL I/O PHASE MODULATOR

Example 1 was repeated, except that the optical waveguide 14 measured 3 μm deep ×8 μm wide (λ=1.5 μm).

EXAMPLE 3

PREPARATION AND TESTING OF A MICROWAVE/OPTICAL ASYMMETRIC INTERFEROMETER

Example 2 was repeated, except that the optical waveguide 14 was split into two paths having a pathlength difference of λ/4 (λ=1.3 μm). The two paths of the interferometer were parallel and separated by about 15 μm.

The mask 22 was placed on the wafer, and positioned so that the top section 38 of the inner arc 28 was positioned over and parallel to one path of the interferometer 14 and so the top edge of the center area 30 was positioned over and parallel to the other path of the interferometer 14.

EXAMPLE 4

PREPARATION AND TESTING OF A MICROWAVE/OPTICAL SYMMETRIC INTERFEROMETER

Example 3 was repeated, except that the two paths of the optical waveguide 14 had essentially equal pathlengths.

Obviously, many modifications and variations of the present invention are possible in light of the above teachings. It is therefore to be understood that, within the scope of the appended claims, the invention may be practiced otherwise than as specifically described.

What is claimed is:

1. A process for making a metal structure having a thickness between about 10 μm and about 50 μm on a substrate, comprising the steps of:
   selectively exposing a layer of photoresist disposed on a substrate with patterned ultraviolet radiation comprising the 350 nm to 450 nm portion of the spectrum of a mercury vapor lamp, wherein said photoresist layer is a heat-treated and hydrated photoresist layer having a thickness between about 10 μm and about 50 μm, to fully expose selected portions of said photoresist layer on said substrate;
   contacting said photoresist layer with a photoresist developing solution, to selectively remove said irradiated photoresist from said substrate, thereby selectively uncovering portions of said substrate;
   exposing said photoresist layer to a plasma for hardening said photoresist against thermal flow;
   hardbaking said photoresist on said substrate;
   plating said metal onto said selectively uncovered portions of said substrate by contacting said substrate with a plating solution and applying a current density to said substrate selected to prevent liftoff of said photoresist from said substrate and also to prevent degradation of the photoresist surface, thereby making said metal structure on said substrate.

2. The process of claim 1, further comprising, after said step of hardbaking said photoresist, the step of gradually cooling said substrate to prevent thermal stress cracks in said photoresist.

3. The process of claim 1, wherein said step of plating said metal onto said selectively uncovered portions of said substrate further comprises applying a current density to said substrate of between about 0.3 mA/cm$^2$ and about 0.9 mA/cm$^2$.

4. The process of claim 1, wherein said step of plating said metal onto said selectively uncovered portions of said substrate further comprises applying a current density to said substrate of between about 0.4 mA/cm$^2$ and about 0.8 mA/cm$^2$.

5. The process of claim 4, wherein said step of applying a current density to said substrate of between about 0.4 mA/cm$^2$ and about 0.8 mA/cm$^2$ comprises applying a current density of between about 0.4 mA/cm$^2$ and about 0.5 mA/cm$^2$ for between about 0.5 hours and about 2.0 hours, and then increasing the current density to between about 0.7 mA/cm$^2$ and about 0.8 mA/cm$^2$ until the desired metal thickness is achieved.

6. The process of claim 1, wherein said metal structure is between about 15 μm and about 50 μm thick.

7. The process of claim 1, wherein said metal structure is between about 20 μm and about 50 μm thick.

8. The process of claim 1, wherein said metal structure is between about 20 μm and about 50 μm thick.

9. The process of claim 1, wherein said plating solution is essentially pH neutral.

10. The process of claim 1, wherein said plating solution has a pH of between about 5.5 to about 6.0.

11. A process for making an arcuate metal structure on a substrate, comprising the steps of claim 1, wherein said step of selectively exposing said photoresist further comprises selectively exposing said photoresist in an arcuate pattern.

12. A process for making an annular metal structure on a substrate, comprising the steps of claim 1, wherein said step of selectively exposing said photoresist further comprises selectively exposing said photoresist in an annular pattern.

13. A process for making a microwave/optical travelling wave integrated input/output modulator, comprising the steps of claim 1, wherein said substrate comprises an electrooptic crystalline layer having an upper face, an optical waveguide on said upper face of said electrooptic crystalline layer, and an optically transparent dielectric buffer layer on said upper face and said optical waveguide, and wherein said photoresist layer is disposed on said optically transparent dielectric buffer layer.

14. The process of claim 13, further comprising, after said step of hardbaking said photoresist, the step of gradually cooling said substrate to prevent thermal stress cracks in said photoresist.

15. The process of claim 13, wherein said step of plating said metal onto said uncovered portions of said substrate further comprises applying a current density to said substrate of between about 0.3 mA/cm$^2$ and about 0.9 mA/cm$^2$.

16. The process of claim 13, wherein said step of plating said metal onto said uncovered portions of said substrate further comprises applying a current density to said substrate of between about 0.4 mA/cm$^2$ and about 0.8 mA/cm$^2$.

17. The process of claim 16, wherein said step of applying a current density to said substrate of between about 0.4 mA/cm$^2$ and about 0.8 mA/cm$^2$ comprises applying a current density of between about 0.4 mA/cm$^2$ and about 0.5 mA/cm$^2$ for between about 0.5 hours and about 2.0 hours, and then increasing the current density to between about 0.7 mA/cm$^2$ and about 0.8 mA/cm$^2$ until the desired metal thickness is achieved.

18. The process of claim 13, wherein said metal structure is between about 15 μm and about 50 μm thick.

19. A process for making a metal structure having a thickness between about 10 μm and about 50 μm on a substrate, comprising the steps of:
   depositing a layer of photoresist onto a substrate, wherein said photoresist is photoreactive with ultraviolet light;
   flattening said photoresist layer by removing any edgebead from said photoresist layer;
   heating said photoresist layer until said photoresist layer softens;
   hydrating said photoresist layer by exposing said photoresist layer to a humid atmosphere;
   exposing selected portions of said photoresist layer to sufficient ultraviolet radiation comprising the full spectrum of a mercury vapor lamp to photoreact the entire thickness of said selected portions of said photoresist;

contacting said selectively photoreacted photoresist layer with photoresist developer, to selectively uncover said substrate;

exposing said photoresist layer to a plasma comprising $CF_4$ and He, to harden said photoresist layer against thermal flow;

hardbaking said photoresist on said substrate;

gradually cooling said substrate to prevent thermal stress cracks in said photoresist;

plating said metal onto said uncovered portions of said substrate, thereby making said metal structure on said substrate.

20. The process of claim 19, wherein said step of depositing a thick layer of thick-film photoresist onto a substrate further comprises;

dehydrating said substrate;

applying a commercial photoresist adhesion promoter to said substrate;

iteratively applying a photoresist material to said substrate, spinning said substrate, baking said photoresist material until said photoresist material is solidified, and repeating these steps until said substrate has a photoresist film covering with an average thickness of between about 10 $\mu$m and about 20 $\mu$m.

21. The process of claim 19, wherein said step of gradually cooling said substrate to prevent thermal stress cracks in said photoresist further comprises cooling said substrate at a rate of between about 1° C./min and about 5° C./min.

22. The process of claim 19, wherein said step of gradually cooling said substrate to prevent thermal stress cracks in said photoresist further comprises furnace cooling said substrate.

* * * * *